(12) United States Patent
Peng et al.

(10) Patent No.: US 11,146,164 B2
(45) Date of Patent: Oct. 12, 2021

(54) SINGLE TRANSFORMER-BASED GATE DRIVER

(71) Applicant: The Florida State University Research Foundation, INc., Tallahassee, FL (US)

(72) Inventors: Fang Peng, Tallahassee, FL (US); Hui Li, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 17/154,673

(22) Filed: Jan. 21, 2021

(65) Prior Publication Data

US 2021/0226525 A1 Jul. 22, 2021

Related U.S. Application Data

(60) Provisional application No. 62/963,813, filed on Jan. 21, 2020.

(51) Int. Cl.
| | |
|---|---|
| *H02M 1/08* | (2006.01) |
| *H02M 1/32* | (2007.01) |
| *H03K 17/691* | (2006.01) |

(52) U.S. Cl.
CPC .............. *H02M 1/08* (2013.01); *H02M 1/32* (2013.01); *H03K 17/691* (2013.01)

(58) Field of Classification Search
CPC ......... H02M 1/08; H02M 1/32; H03K 17/691

USPC .... 327/427, 434, 437, 108–112; 326/82, 83, 326/87

See application file for complete search history.

(56) References Cited

U.S. PATENT DOCUMENTS

| | | | | |
|---|---|---|---|---|
| 8,451,626 | B2* | 5/2013 | Coleman | H02M 3/1582 363/17 |
| 9,966,837 | B1* | 5/2018 | Seaton | H02M 1/08 |
| 10,818,474 | B1* | 10/2020 | Ryu | H02M 7/5395 |
| 2015/0222263 | A1* | 8/2015 | Nagai | H03K 17/6877 327/382 |

FOREIGN PATENT DOCUMENTS

EP 3514928 7/2019

\* cited by examiner

*Primary Examiner* — Tomi Skibinski
(74) *Attorney, Agent, or Firm* — Meunier Carlin & Curfman LLC

(57) ABSTRACT

The disclosure relates to a devices, systems and methods implementing a single transformer-based gate driver. In one embodiment, single transformer-based gate driver includes an RF source; a PWM controller; an edge detector and pulse generating circuit operably connected to the RF source and PWM controller; a transformer comprising a primary side and a secondary side, the primary side of the transformer operably connected to an output of the edge detector and pulse generating circuit, the secondary side of the transformer operably connected to a rectifier circuit and a signal recovery circuit; and a drive circuit operably connected to the rectifier circuit and the signal recovery circuit.

13 Claims, 6 Drawing Sheets

SINGLE TRANSFORMER-BASED GATE DRIVER

CROSS-REFERENCE TO RELATED APPLICATION

This application claims priority to and benefit of U.S. provisional patent application Ser. No. 62/963,813 filed Jan. 21, 2020, which is fully incorporated by reference and made a part hereof.

BACKGROUND

Electrical switching devices, such as transistors, generally require an input current or voltage to switch the state of the switching device. The switching current or voltage may be greater than the current or voltage that the circuit controlling the switching device can produce. This is common in applications where the controller is a microcontroller or other integrated circuit, and the switching device is a high-power device such as a power MOSFET (metal-oxide-semiconductor field effect transistor). Gate driver circuits are used to amplify the output current or voltage of the control circuit to produce a current and/or voltage large enough to switch the state of the switching device.

Some gate driver circuits use a transformer to electrically isolate the controller from the switching device. Previous attempts to build a gate driver with a transformer require a secondary power source, and/or a second transformer to power the drive circuit, resulting in additional size, materials, and manufacturing costs.

Therefore, what is needed are devices, methods, and systems implementing a single transformer-based gate driver. In particular, devices, methods, and systems implementing a single transformer-based gate driver that are capable of transmitting a pulse width modulation signal or patterned gating signal and amplifying the signal to the switching device.

SUMMARY

Disclosed and described herein are embodiments of devices, methods, and systems for implementing a single transformer-based gate driver.

In one aspect, the present disclosure relates to a single transformer-based gate driver. In one embodiment, the single transformer-based gate driver includes an RF source; a PWM controller; an edge detector and pulse generating circuit operably connected to the RF source and PWM controller; a transformer comprising a primary side and a secondary side, the primary side of the transformer operably connected to an output of the edge detector and pulse generating circuit, the secondary side of the transformer operably connected to a rectifier circuit and a signal recovery circuit; and a drive circuit operably connected to the rectifier circuit and the signal recovery circuit.

In one embodiment, the drive circuit is operably connected to a switch.

In one embodiment, the switch is a power transistor.

In one embodiment, a protection circuit is operably connected between the rectifier circuit and the drive circuit.

In one embodiment, a fault detection circuit is operably connected to the protection circuit.

In one embodiment, the fault detection circuit is operably connected to the PWM controller.

In one aspect, the present disclosure relates to a method for driving a power switching device. In one embodiment, the method includes: providing an RF signal and a PWM signal; modulating the RF signal with the PWM signal to create a primary signal; applying the primary signal through a primary side of a transformer; receiving a secondary signal to the secondary side of the transformer; rectifying the secondary signal to produce a power signal; deriving a recovered PWM signal from the secondary signal; and driving a drive circuit using the recovered PWM signal and the power signal.

In one embodiment, the drive circuit drives a switch.

In one embodiment, the switch is a transistor.

In one embodiment, the power signal is passed through a protection circuit before being applied to the drive circuit.

In one embodiment, the protection circuit is used to generate a protection circuit signal, and the protection circuit signal is used to drive a fault transfer circuit.

In one embodiment, the fault transfer circuit produces a fault transfer circuit signal.

In one embodiment, the fault transfer circuit signal controls the state of the converter.

BRIEF DESCRIPTION OF THE DRAWINGS

The accompanying drawings, which are incorporated in and constitute a part of this specification, illustrate embodiments and together with the description, serve to explain the principles of the disclosed technology.

DETAILED DESCRIPTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
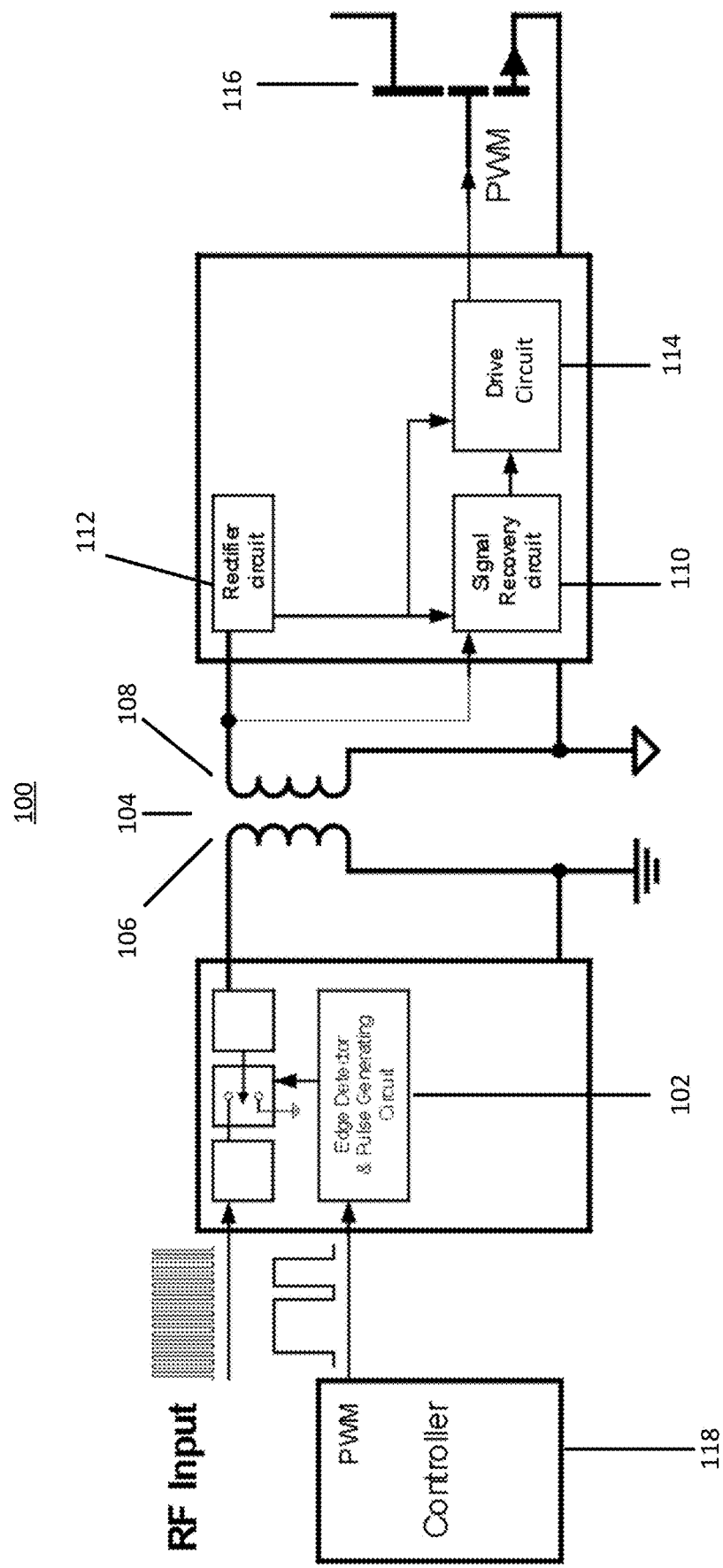
FIG. 1 is a schematic of an embodiment of a single transformer-based gate driver.

FIG. 1 is a schematic of an embodiment of a single transformer-based gate driver 100. The input signals include a pulse width modulation (PWM) signal and a second input signal. Control signals other than PWM signals may be used in some embodiments of the present disclosure, including patterned gating signals. In some embodiments, the second input signal may be a Radio Frequency (RF) signal, as shown in FIG. 1. The edge detector and pulse generating circuit 102 modulates the second input signal with the PWM signal and the resulting signal passes through the primary side 106 of the transformer 104. Higher frequency RF signals may allow for smaller transformers 104 to be used. In some embodiments, the RF signal is in the range of GHz. The signal from the primary side 106 of the transformer 104 passes to the secondary side 108 of the transformer 104. The secondary side 108 of the transformer 104 includes a rectifier circuit 112 and a signal recovery circuit 110. The signal recovery circuit 110 may extract information about the original signal from the signal on the secondary side 108 of the transformer 104. This extracted information may include the rising edge and falling edge of the original gate signal. In some embodiments, the extracted information is used to approximate or reconstruct the original PWM signal. The rectifier circuit 112 powers a drive circuit 114. The drive circuit 114 receives a drive signal from the signal recovery circuit 110. The configuration of rectifier circuit 112 and signal recovery circuit 110 allows for both power and gate signals to be transmitted across the transformer 104, which electrically isolates the circuit connected to the primary side 106 of the transformer 104 from the circuit connected to the secondary side 108 of the transformer 104. The drive circuit 114 then acts as a gate driver, producing a PWM input to the switching device 116 that is sufficient to drive the switching device 116. The present disclosure contemplates that the input to the switching device 116 may have different current, voltage, or power characteristics than the input control signal. Therefore, some embodiments of the present disclosure may act as an act as an amplifier.

Figure 2:
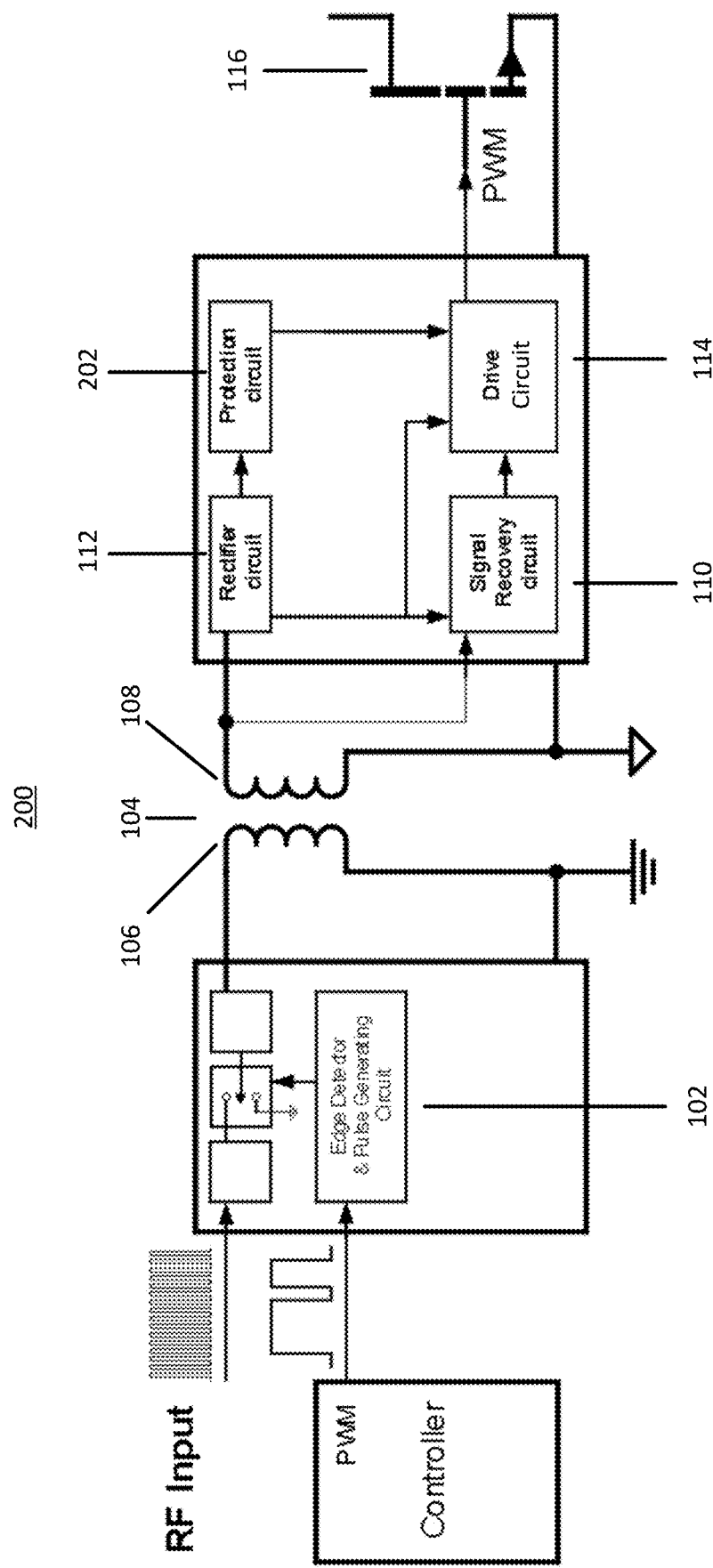
FIG. 2 is a schematic of an embodiment of a single transformer-based gate driver including a protection circuit.
Figure 3:
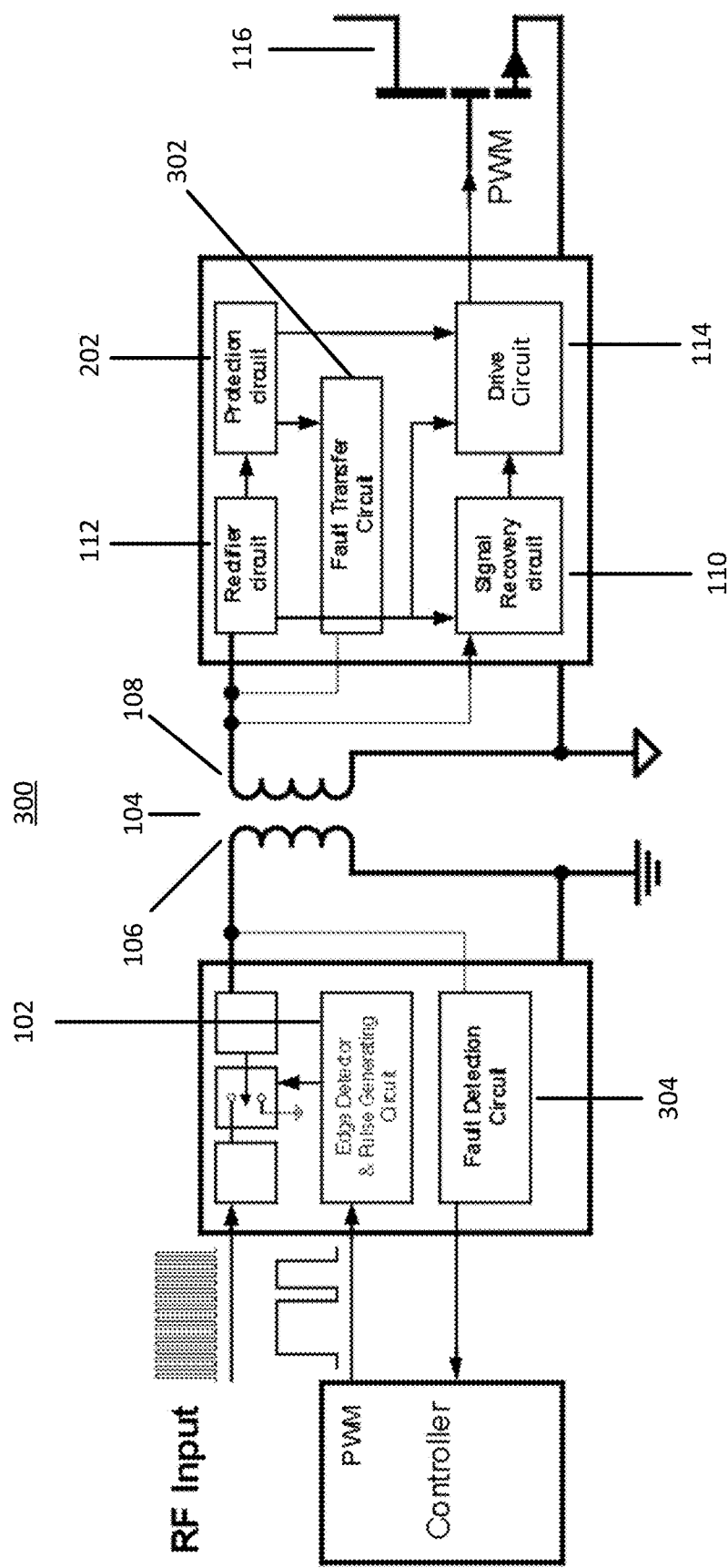
FIG. 3 is a schematic of an embodiment of a single transformer-based gate driver including a protection circuit and a fault transfer circuit.

FIG. 2 is a schematic of an embodiment of a single transformer-based gate driver 200 including a protection circuit 202. The protection circuit 202 is operably connected between the rectifier circuit 112 and the drive circuit 114. Similarly, FIG. 3 includes both a protection circuit 202, a fault transfer circuit 302, and a fault detection circuit 304. Other circuits may be added to these embodiments to achieve different objectives, including other protection and control circuits.

Figure 4:
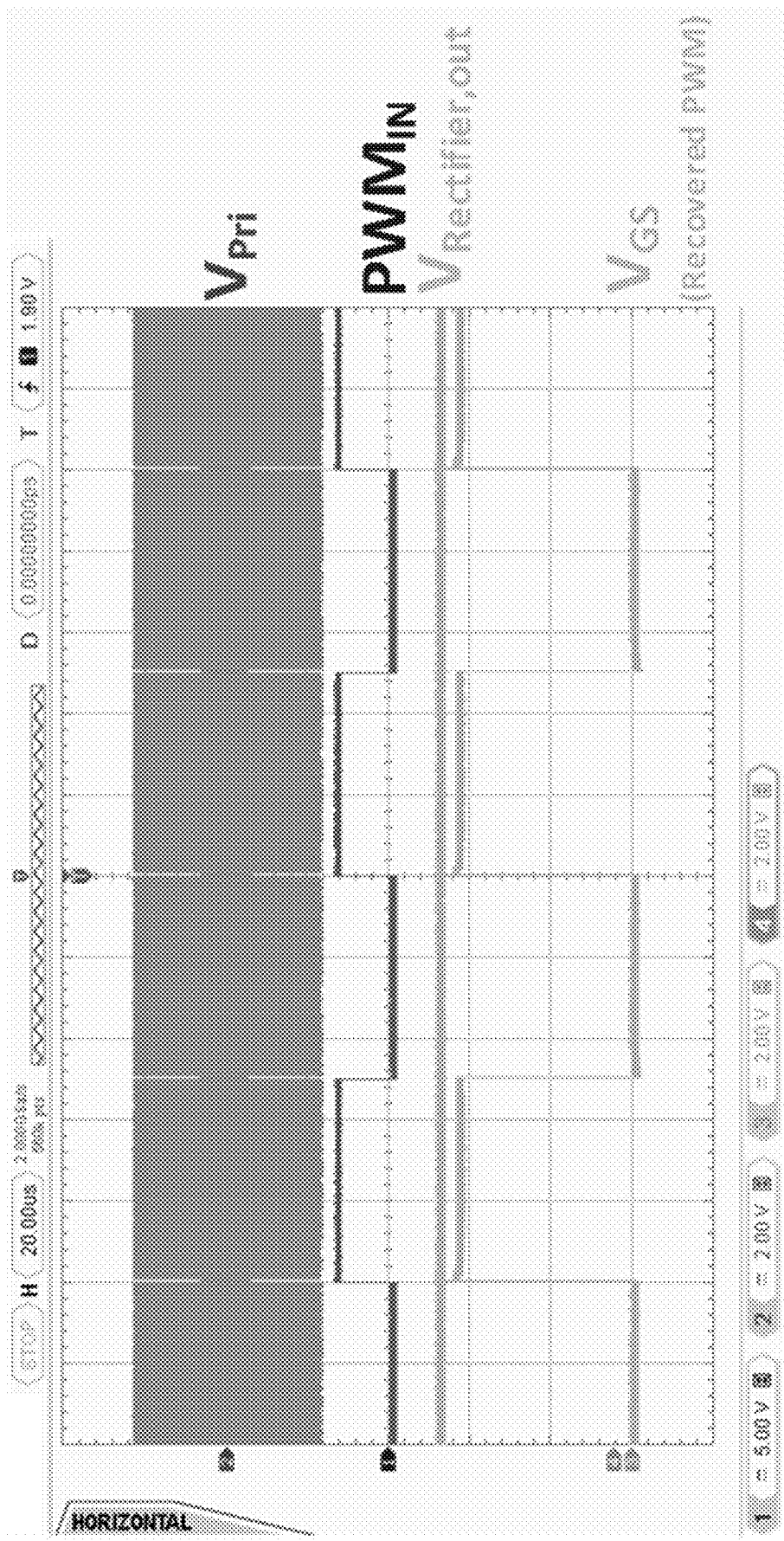
FIG. 4 is an illustration of an experimental result, showing the pulse width modulation (PWM) input and PWM output.

FIG. 4 is an illustration of an experimental result, showing the pulse width modulation (PWM) input and PWM output according to embodiments described herein. $V_{GS}$ shows the PWM signal that has been recovered from the input PWM signal (shown as $PWM_{IN}$). $V_{Pri}$ shows the voltage on the primary side of the transformer, which includes the RF signal that has been modulated with the PWM signal.

Figure 5:
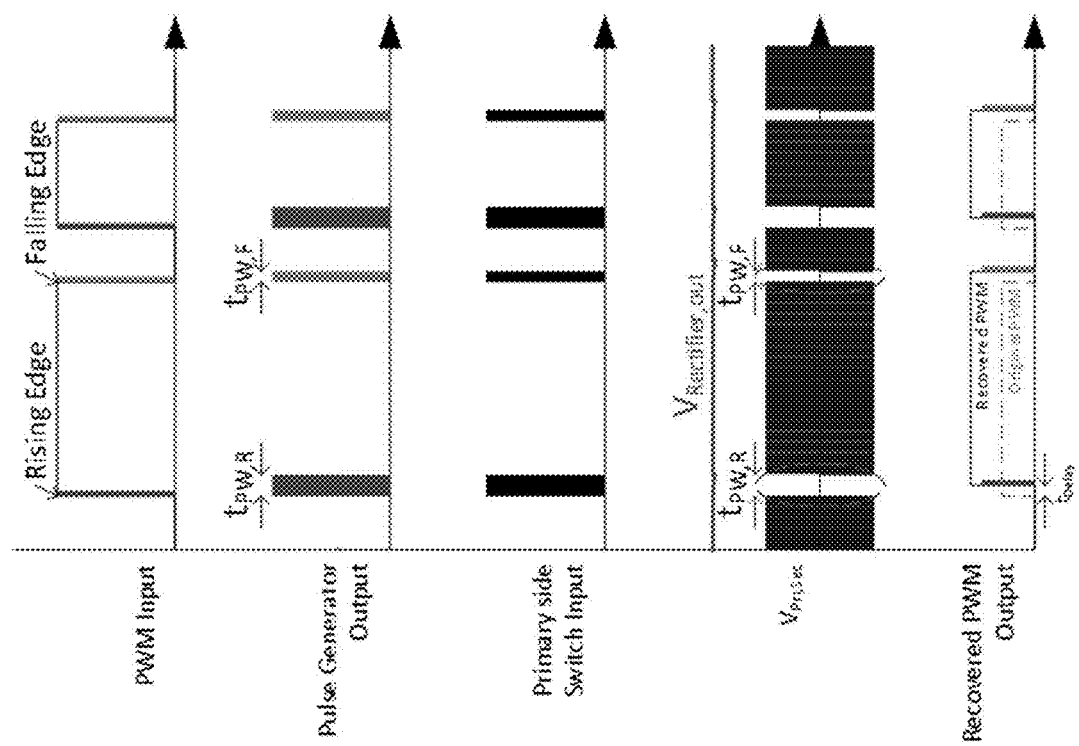
FIG. 5 is an illustration of the relationship between the voltages and time periods of signals within some embodiments of a single transformer-based gate driver.

FIG. 5 is an illustration of the relationship between the voltages and time periods of signals within some embodiments of a single transformer-based gate driver. The x-axis shows time, and the y-axis shows a voltage. The PWM Input, depicted in the first graph, is converted into pulses by the pulse generating circuit. The pulses are shown in the second graph "Pulse generator output." The third graph "Primary side Switch Input" illustrates a non-limiting example of a control input signal. The fourth graph illustrates the voltage waveform across the primary and secondary windings of the transformer as $V_{Pri,Sec}$. Additionally, the fourth graph depicts the output of the rectifier as "VRectifier, out." The fifth graph, "Recovered PWM Output" shows the PWM signal that that drives the gate of the switching device. The "Recovered PWM Output" signal is produced by using a signal recovery circuit to replicate the original PWM signal to drive the gate of the switching device.

Figure 6:
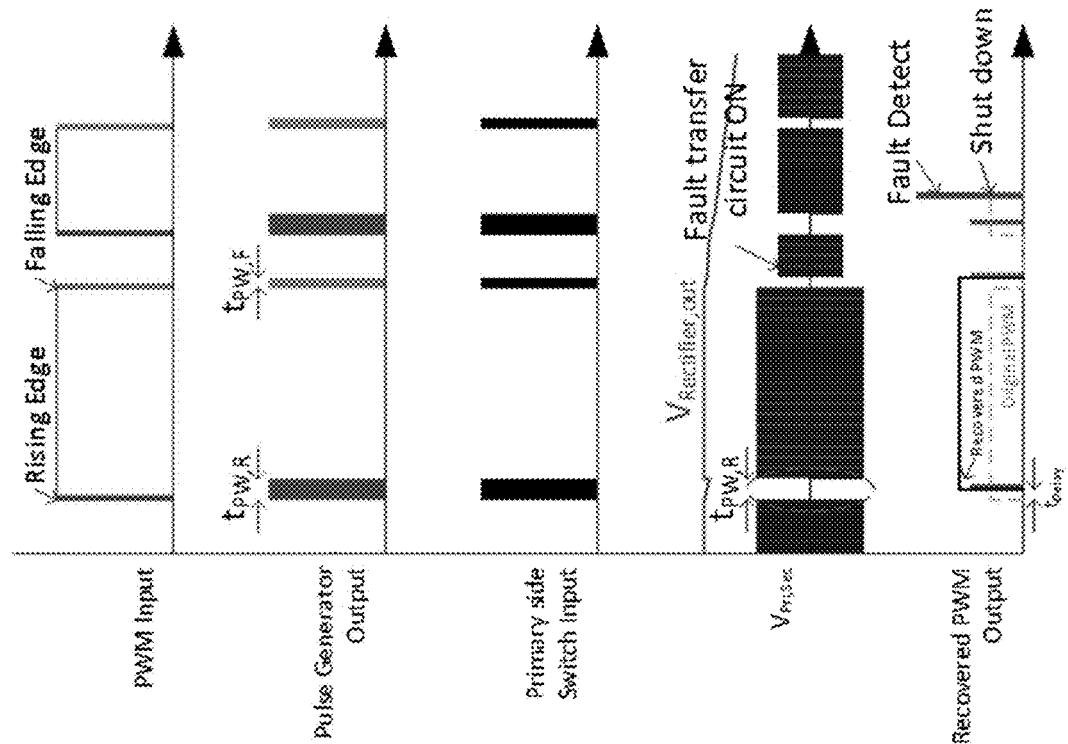
FIG. 6 is an illustration of the relationship between the voltages and time periods of signals within an embodiment of a single transformer-based gate driver implementing a fault transfer circuit. The illustration also shows an operation of the fault transfer circuit in an embodiment of the single transformer-based gate driver implementing a fault transfer circuit.

FIG. 6 is an illustration of the relationship between the voltages and time periods of signals within an embodiment of a single transformer-based gate driver implementing a fault transfer circuit. The illustration also shows an operation of the fault transfer circuit in an embodiment of the single transformer-based gate driver implementing a fault transfer circuit. The x-axis shows time, and the y-axis shows voltage. The PWM Input, depicted in the first graph, is converted into pulses by the pulse generating circuit. The pulses are shown in the second graph "Pulse generator output." The third graph "Primary side Switch Input" illustrates a non-limiting example of a control input signal. The fourth graph illustrates the voltage waveform across the primary and secondary windings of a transformer as $V_{Pri,Sec}$. Additionally, the fourth graph shows the output of the rectifier as "VRectifier, out." Finally, the fourth graph also illustrates voltage waveforms after the fault transfer circuit is activated. The fifth graph, "Recovered PWM Output" shows the PWM that that drives the gate of the switching device. The "Recovered PWM Output" signal is produced by using a signal recovery circuit to replicate the original PWM signal to drive the gate of the switching device. The fourth and fifth graphs show how an implementation of the fault transfer circuit operates in some embodiments of the single transformer-based gate driver.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A single transformer-based gate driver, the single transformer-based gate driver comprising:
    an RF source;
    a PWM controller;
    an edge detector and pulse generating circuit operably connected to the RF source and PWM controller;
    a transformer comprising a primary side and a secondary side, the primary side of the transformer operably connected to an output of the edge detector and pulse generating circuit, the secondary side of the transformer operably connected to a rectifier circuit and a signal recovery circuit; and
    a drive circuit operably connected to the rectifier circuit and the signal recovery circuit.

2. The single transformer-based gate driver of claim 1, wherein the drive circuit is operably connected to a switch.

3. The single transformer-based gate driver of claim 2, wherein the switch is a power transistor.

4. The single transformer-based gate driver of claim 1, wherein a protection circuit is operably connected between the rectifier circuit and the drive circuit.

5. The single transformer-based gate driver of claim 4, wherein a fault detection circuit is operably connected to the protection circuit.

6. The single transformer-based gate driver of claim 5, wherein the fault detection circuit is operably connected to the PWM controller.

7. A method for driving a power switching device, the method comprising:
    providing an RF signal and a PWM signal;
    modulating the RF signal with the PWM signal to create a primary signal;
    applying the primary signal to a primary side of a transformer;
    receiving a secondary signal from a secondary side of the transformer; rectifying the secondary signal to produce a power signal; deriving a recovered PWM signal from the secondary signal; and driving a drive circuit using the recovered PWM signal and the power signal.

8. The method of claim 7, wherein the drive circuit drives a switch.

9. The method of claim 8, wherein the switch is a power transistor.

10. The method of claim 7, wherein the power signal is passed through a protection circuit before being applied to the drive circuit.

11. The method of claim 7, wherein the protection circuit is used to generate a protection circuit signal, and the protection circuit signal is used to drive a fault transfer circuit.

12. The method of claim 11, wherein the fault transfer circuit produces a fault transfer circuit signal.

13. The method of claim 12, wherein the fault transfer circuit signal controls the state of the RF signal or PWM signal.

* * * * *